(12) United States Patent
Yao et al.

(10) Patent No.: US 7,019,394 B2
(45) Date of Patent: Mar. 28, 2006

(54) CIRCUIT PACKAGE AND METHOD OF PLATING THE SAME

(75) Inventors: Xiaowei Yao, Fremont, CA (US); Tam Nguyen, San Jose, CA (US); Marc Finot, Palo Alto, CA (US); Rickie C. Lake, Sunnyvale, CA (US); Jeffrey A. Bennett, Sunnyvale, CA (US); Robert Kohler, Zurich (CH)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/674,370

(22) Filed: Sep. 30, 2003

(65) Prior Publication Data
US 2005/0077609 A1    Apr. 14, 2005

(51) Int. Cl.
*H01L 23/053*    (2006.01)
(52) U.S. Cl. .................. 257/700; 257/706; 257/712
(58) Field of Classification Search ................ 257/698, 257/700, E23.141, E23.174, E23.169, 706, 257/712, 720
See application file for complete search history.

(56) References Cited

U.S. PATENT DOCUMENTS

| | | | | |
|---|---|---|---|---|
| 3,577,038 A | * | 5/1971 | Cook, Jr. .................... 257/204 |
| 3,956,052 A | * | 5/1976 | Koste et al. ................. 156/247 |
| 3,956,726 A | | 5/1976 | McCarthy et al. ........... 337/414 |
| 4,464,420 A | * | 8/1984 | Taguchi et al. ............. 427/97.4 |
| 4,703,339 A | * | 10/1987 | Matsuo ........................ 257/706 |
| 5,014,904 A | * | 5/1991 | Morton ........................ 228/176 |
| 5,031,029 A | | 7/1991 | Acocella et al. ............. 257/712 |
| 5,057,906 A | | 10/1991 | Ishigami ....................... 357/80 |
| 5,227,662 A | | 7/1993 | Ohno et al. .................. 257/676 |
| 5,235,211 A | * | 8/1993 | Hamburgen ................. 257/758 |
| 5,430,331 A | | 7/1995 | Hamzehdoost et al. ..... 257/796 |
| 5,440,169 A | | 8/1995 | Tomita et al. ............... 257/667 |
| 5,530,295 A | | 6/1996 | Mehr ........................... 257/796 |
| 5,532,070 A | * | 7/1996 | Takahashi et al. .......... 428/643 |

(Continued)

FOREIGN PATENT DOCUMENTS

JP    5-294744    11/1993

(Continued)

OTHER PUBLICATIONS

"Thermal VIA/BGA", Micro Substrates Corporation, website, 3 pages, © 2000, found at: http://www.microsubstrates.com/body_thermal%20via_bga.html. on Sep. 13, 2003.

(Continued)

*Primary Examiner*—Matthew Smith
*Assistant Examiner*—Lex H. Malsawma
(74) *Attorney, Agent, or Firm*—Marshall, Gerstein & Borun LLP

(57) ABSTRACT

A circuit package includes a base portion and a first metal pattern disposed on a substrate surface. Second and third metal patterns are disposed on another substrate surface, and electrically coupled to first and second vias. The third metal pattern forms a gap to electrically isolate it from the second metal pattern. A circuit package includes a substrate having an opening and a single heat sink positioned in the opening to expose top and bottom surfaces through top and bottom surfaces of the substrate. Selective plating includes applying first and second metal patterns to a substrate surface, creating a potential voltage difference between the first metal pattern and a metal source, and plating the first metal pattern by attracting a first metal type to the voltage potential of the first metal pattern. The voltage potential of the first metal pattern is less than the voltage potential of the metal source.

29 Claims, 4 Drawing Sheets

U.S. PATENT DOCUMENTS

| | | | |
|---|---|---|---|
| 5,703,399 A | 12/1997 | Majumdar et al. | 257/723 |
| 5,751,063 A * | 5/1998 | Baba | 257/723 |
| 5,790,379 A * | 8/1998 | Kang | 361/719 |
| 5,900,673 A * | 5/1999 | Nishi et al. | 257/772 |
| 5,920,458 A * | 7/1999 | Azar | 361/704 |
| 6,191,478 B1 | 2/2001 | Chen | 257/718 |
| 6,239,487 B1 | 5/2001 | Park et al. | 257/712 |
| 6,281,574 B1 | 8/2001 | Drake et al. | 257/706 |
| 6,432,750 B1 | 8/2002 | Jeon et al. | 438/122 |
| 6,471,822 B1 | 10/2002 | Yin et al. | 156/345.49 |
| 6,563,696 B1 * | 5/2003 | Harris et al. | 361/619 |
| 6,780,672 B1 * | 8/2004 | Steele et al. | 438/107 |
| 2002/0140085 A1 * | 10/2002 | Lee et al. | 257/724 |
| 2004/0021217 A1 * | 2/2004 | Epitaux et al. | 257/700 |

FOREIGN PATENT DOCUMENTS

| | | |
|---|---|---|
| JP | 6-37250 | 2/1994 |
| JP | 6-291362 | 10/1994 |
| JP | 8-204120 | 8/1996 |
| JP | 9-102580 | 4/1997 |
| JP | 9-139461 | 5/1997 |
| JP | 2000-138342 | 5/2000 |

OTHER PUBLICATIONS

Technical Schematic entitled "Modification of Ceramic Detail, Thickness & Base," dated Jan. 29, 2003, Kyocera Corporation.

* cited by examiner

CIRCUIT PACKAGE AND METHOD OF PLATING THE SAME

TECHNICAL FIELD

The present disclosure relates generally to circuit packages, and more particularly, to a circuit package and method of making a circuit package for optoelectronic devices.

BACKGROUND

Optoelectronic devices, such as transponders, may require RF integrity (i.e., avoiding electrical shortages in the device), hermetical sealing (i.e., a technique of making a material impervious to air and/or fluids by fusion), thermal dissipation (i.e., drawing away heat generated by the device to avoid overheating) or selective plating (i.e., a technique to deposit different metals and/or alloys on conducting materials). Currently, for example, substrate selective plating is performed manually by applying an inert mask material to selected metal surfaces or patterns. To illustrate this concept, a first metal surface may need nickel (Ni) plating while a second metal surface may need gold (Au) plating. In particular, the process may begin with masking the second metal surface with an inert paste (i.e., cover the second surface with the inert paste) while the first metal surface may be plated by nickel. The inert paste may be cleaned off to the second metal surface. Accordingly, the first metal surface may then be covered by an inert paste while the second metal surface may be plated by gold. Afterward, the inert paste may be cleaned off the first metal surface. The first and second metal surfaces may be plated differently but the process involved may be inefficient, expensive and may introduce impurities into the various plating. For example, laser welding performed on a nickel-plated pattern may result in cracks due to gold impurities introduced in the nickel plating.

Optoelectronic devices may further require thermal dissipation to disperse heat that may be generated by optoelectronic devices formed on top of a substrate. Currently, for example, optoelectronic devices may be formed on a ceramic substrate. The ceramic substrate may include thermal vias to dissipate heat generated by the optoelectronic device. However, thermal vias may be inefficient for optoelectronic devices that require high thermal dissipation.

Therefore, a need exists for an efficient, low-cost means to provide selective plating or different plating as well as efficient thermal dissipation while avoiding RF interference and maintaining a hermetic seal.

BRIEF DESCRIPTION OF THE DRAWINGS

This disclosure will describe several embodiments to illustrate its broad teachings. Reference is also made to the attached drawings.

DETAILED DESCRIPTION

Figure 1:
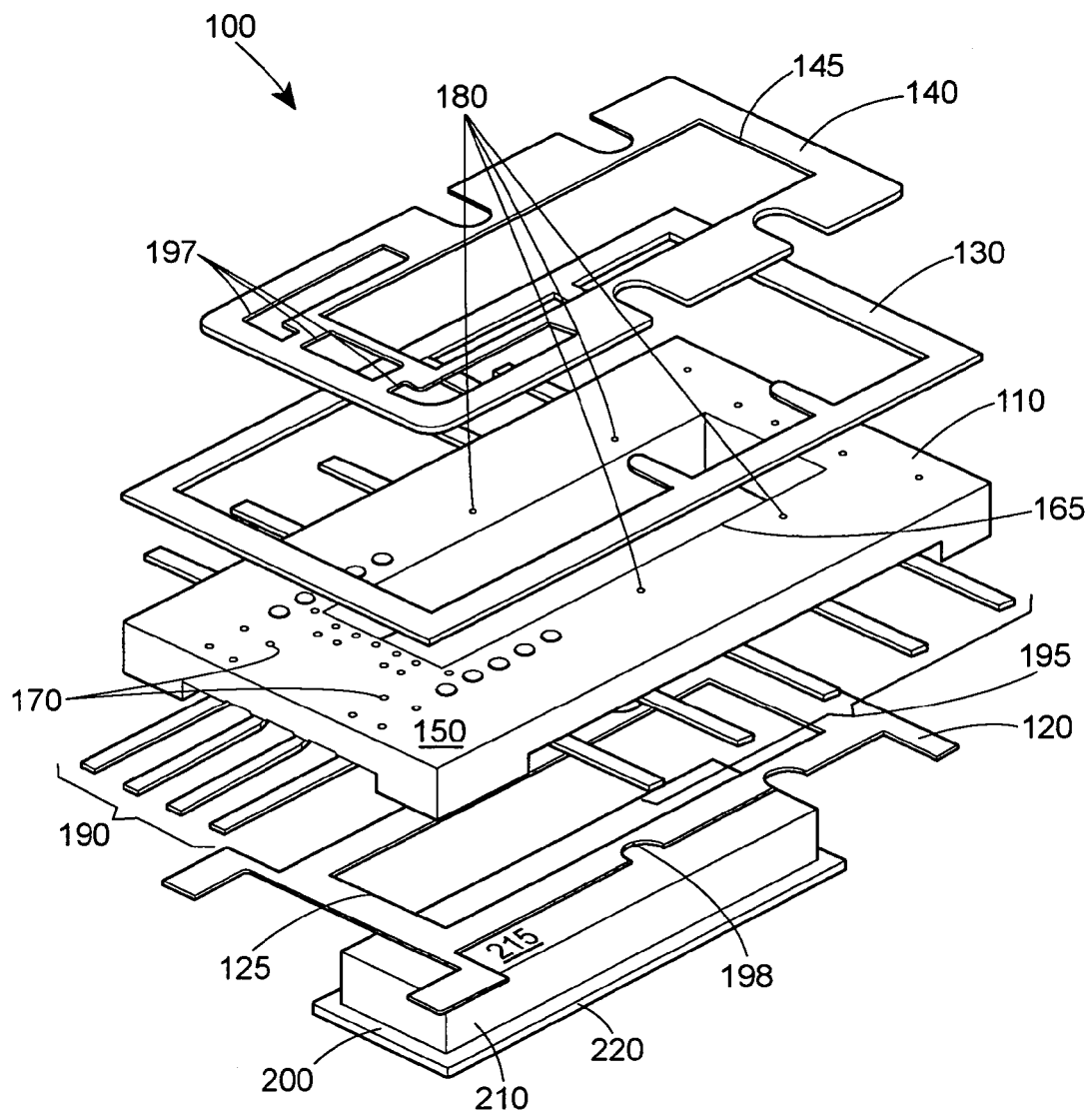
FIG. 1 is an exploded view of a schematic diagram representation of a circuit package.

Circuit packages and methods of plating the same are described herein. In particular, a circuit package may include a base portion, a first metal pattern, a second metal pattern, and a third metal pattern. The base portion may include a first surface, a second surface, a first via, a second via, and a plurality of pins. For example, the base portion may be a substrate and may be, but is not limited to, a ceramic substrate such as an alumina substrate or an aluminum nitride (AlN) substrate. The first metal pattern may be disposed on the first surface of the base portion. The second and third metal patterns may be disposed on the second surface. The second metal pattern may be electrically coupled to the first via. The third metal pattern may be electrically coupled to the first metal pattern through the second via. The circuit package may further include a nickel-plated pattern electrolytically disposed on the second metal pattern whereas a gold-plated pattern may be electrolytically disposed on the third metal pattern. The third metal pattern may be arranged to form a gap to electrically isolate the second metal pattern from the third metal pattern.

The circuit package may also include a single heat sink arranged to dissipate heat from a device built on the circuit package. The base portion may include an opening arranged to engage the heat sink and the third metal pattern may include an opening arrange to expose the device to the heat sink. The heat sink may include a body of the same size and shape as the opening and a flange extending outwardly from the body. The flange may have a perimeter edge larger than a perimeter edge of the opening. The body may be the same thickness as the opening. The heat sink may be engaged with the base portion via a braze alloy, which may be, but is not limited to, a copper silver braze alloy. The braze alloy may bond the heat sink to the base portion and provide a hermetic seal. The heat sink may be, but is not limited to, a copper tungsten alloy heat sink. The heat sink may have an upper and lower surface having more surface area than the upper surface. The upper surface may be exposed on the second surface of the base portion and the lower surface may be exposed on the first base portion surface when the heat sink is engaged with the base portion.

Alternatively, the circuit package may include a substrate and a single heat sink. The substrate may include a plurality of pins, a top surface, a bottom surface, a first via, a second via and an opening. The substrate may be, but is not limited to, a ceramic substrate such as an alumina substrate or an aluminum nitride (AlN) substrate. The heat sink may have a top surface and a bottom surface. The heat sink may be positioned within the opening such that the top surface is exposed through the top surface of the substrate and the bottom surface is exposed through the bottom surface of the substrate. The heat sink may be, but is not limited to, a copper tungsten alloy heat sink. The heat sink may be configured to dissipate to heat from a device built on the ceramic substrate. A first metal pattern may be disposed on the top surface and electrically coupled to the first via while a second metal pattern may be disposed on the bottom surface and electrically coupled to the second via, the second metal pattern being electrically isolated from the first metal pattern. First and second plated patterns may be electrolytically disposed on the first and second metal patterns, respectively. The first plated pattern may include, but is not limited to, a gold-plated pattern, and the second plated pattern may include, but is not limited to, a nickel-plated pattern. The heat sink may include a body of the same size and shape as the opening and a flange extending outwardly from the body. The flange may have a perimeter edge larger than a perimeter edge of the opening. The heat sink may be engaged with the base portion via a braze alloy, which may be, but is not limited to, a copper silver braze alloy. The braze alloy may bond the heat sink to the base portion and provide a hermetic seal.

A method of selective plating on a circuit substrate may include applying a first metal pattern to a surface on the substrate, applying a second metal pattern to the surface of the substrate, creating a potential voltage difference between the first metal pattern and a metal source comprising a metal of a first type, and plating the first metal pattern with the metal of a first type. The voltage potential of the first metal pattern may be less than the voltage potential of the metal source, and the plating of the first metal pattern may include attracting the metal of a first type to the voltage potential of the first metal pattern. Creating a potential voltage difference may include applying a negative charge to the first metal pattern and plating the first metal pattern may include attracting the metal of a first type to the negative charge applied to the first metal pattern. Creating a potential voltage difference may also include applying a positive charge to the metal source and electrically coupling the first metal pattern to ground.

The first metal pattern may be electrically coupled to a first via in the substrate and creating a potential voltage difference may include one of applying a negative charge to the first metal pattern through the first via or electrically coupling the first metal pattern to ground through the first via. The second metal pattern may be electrically coupled to a second via in the substrate and the positive charge may be applied to the second metal pattern through the second via. A potential voltage difference may be created between the first metal pattern and the second metal pattern, where the voltage potential of the first metal pattern is less than the voltage potential of the second metal pattern. The plating of the second metal pattern may include attracting the metal of the second type to the negative charge applied to the second metal pattern. The first pattern may be electrically coupled to a cathode whereas the second pattern may be electrically coupled to an anode, which may also be electrically coupled to the metal source.

A potential voltage difference may also be created between the second metal pattern and a metal source comprising a metal of a second type, and the second metal pattern may be plated with the metal of a second type. The voltage potential of the second metal pattern may be less than the voltage potential of the metal source, and the plating of the second metal pattern may include attracting the metal of a second type to the voltage potential of the second metal pattern. A potential voltage difference may be created between the first metal pattern and the second metal pattern, where the voltage potential of the first metal pattern is less then the voltage potential of the second metal pattern. A heat sink may be placed in an opening in the substrate and the heat sink may be brazed to the substrate around the opening to provide a hermetic seal.

An example of a circuit package 100 assembled using a selective plating technique and having improved thermal dissipation is shown generally in FIG. 1. Although the selective plating and thermal dissipation techniques are particularly well suited for a circuit package having different plating materials and utilized with optoelectronics requiring high thermal dissipation, or the like, persons of ordinary skill in the art will readily appreciate that the teachings of the instant invention are not limited to any particular type of circuit package. On the contrary, the teachings of the invention can be employed with virtually any circuit package or other substrate design where thermal dissipation and/or selective plating is desired. Thus, although the circuit package 100 will be described below primarily in relation to optoelectronics, persons of ordinary skill in the art will readily appreciate that the apparatus and method could likewise be used with other types of circuits.

Referring to FIG. 1, a circuit package 100 generally includes a base portion or substrate 110, a first metal pattern 120, a second metal pattern 130, and a third metal pattern 140. The substrate 110 may be, but is not limited to, a ceramic substrate such as an alumina substrate or an aluminum nitride (AlN) substrate. The substrate 110 may include a top surface 150, a bottom surface 160 (see FIG. 3), an opening 165 defined by perimeter edge and extending through the substrate from the top surface 150 to the bottom surface 160, a first plurality of vias (i.e., holes) 170, a second plurality of vias 180, and a plurality of pins (generally shown as 190 and 195). Each of the first and second plurality of vias 170, 180, which may be signal or ground vias, may be a cylindrical hole formed by a mechanical drilling process or a laser machining process that persons of ordinary skill in the art will readily recognize. In a laser machining process, for example, a high-intensity beam of infrared light energy may be focused onto a surface of the ceramic substrate 110 (e.g., the top surface 150). The beam may vaporize some of the material of very small areas in the ceramic substrate 110 to create the first and second plurality of vias 170, 180. The first and second plurality of vias 170, 180 may be filled with a material such as copper tungsten (CuW). The plurality of pins 190, 195 may extend from the bottom surface 160 of the ceramic substrate 110. The plurality of pins 190 may be a plurality of ground pins whereas the plurality of pins 195 may be a plurality of voltage or current biasing pins.

Figure 3:
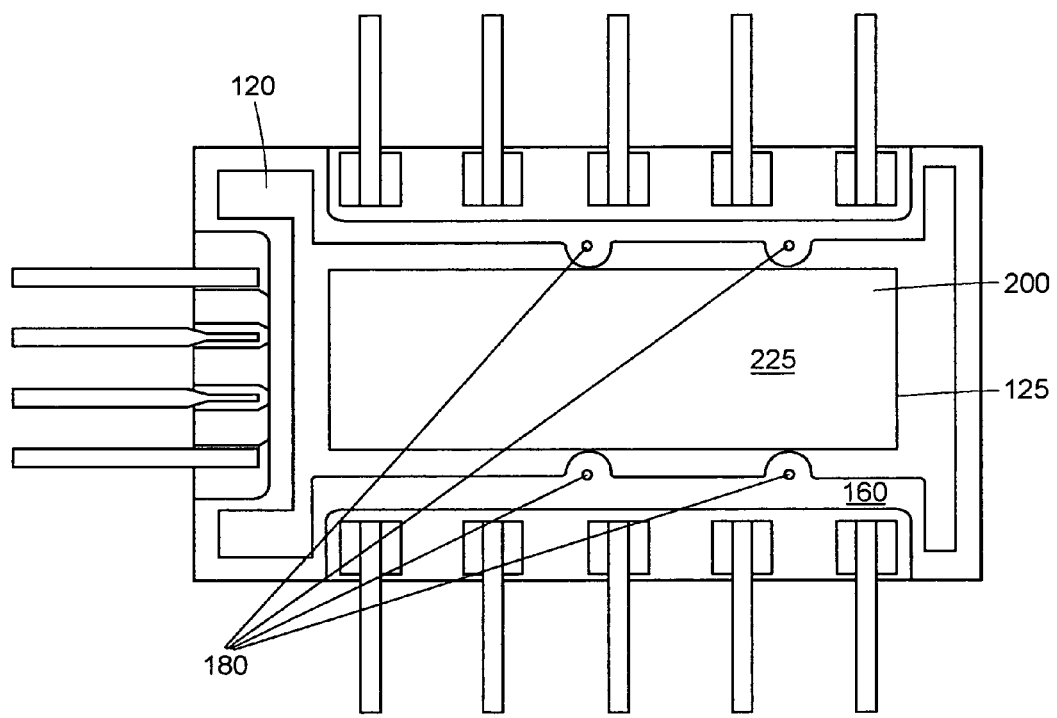
FIG. 3 is a bottom view representation of a circuit package.

The first metal pattern 120 may underlie the ceramic substrate 110 (i.e., the first metal pattern 120 is disposed on the bottom surface 160 of the ceramic substrate 110 as shown in FIG. 3). The first metal pattern 120 may be configured to expose the second plurality of vias 180 on the bottom surface 160 of the ceramic substrate 110. For example, the first metal pattern 120 may include a plurality of semi-circle shaped notches 198. The first metal pattern may further include a cutout or opening 125. The second metal pattern 130 and the third metal pattern 140 may overlie the top surface 150 of the ceramic substrate 110 (i.e., the second and third metal patterns 130, 140 are disposed on the top surface 150 of the ceramic substrate 110 as shown in FIG. 3). The second metal pattern 130 and the third metal pattern 140 may be configured in such a way that a gap 155 is formed to electrically isolate the second and third metal patterns 130, 140 from each other. The third metal pattern 140 may also include a cutout or opening 145.

The first metal pattern 120 and the third metal pattern 140 may be electrically coupled to each other via the first plurality of vias 170. The second metal pattern 130 may be associated with the second plurality of vias 180. Accordingly, voltage may be applied to the second metal pattern 130 via the second plurality of vias 180 and applied to the third metal pattern 140 via the first plurality of vias 170. As a result, the second metal pattern 130 may be electrically isolated from the first and third metal patterns 120, 140. Although each of the first, second, and third metal patterns 120, 130, 140 may be configured to a particular pattern as shown in FIG. 1, persons of ordinary skill in the art will readily recognize that the first, second, and third metal patterns 120, 130, 140 may have different configurations so that the second metal pattern 130 is electrically isolated from the first and third metal patterns 120, 140.

The third metal pattern 140 may include a plurality of openings 197. The plurality of openings 197 may be configured so that the first and second plurality of pins 190, 195 may be electrically isolated. For example, the plurality of openings 197 may include a rectangular-shaped opening and two L-shaped openings. As a result, the plurality of pins 190, 195 may be electrical isolated as current flows through the first plurality of vias 170. Although the plurality of openings 197 described above is particularly well suited for the third metal pattern 140, persons of ordinary skill in the art will readily appreciate that the teachings herein are not limited to such shapes. Persons of ordinary skill in the art will readily appreciate that the plurality of openings 197 may have other shapes. The first metal pattern 120, the second metal pattern 130 and the third metal pattern 140 may be, but are not limited to, a metal patterns such as tungsten patterns, which may be plated with various plating materials. For example, the second metal pattern 120 and the third metal pattern 130 may be plated differently. For example, the second metal pattern 120 may be plated with nickel (Ni) whereas the third metal pattern 130 may be plated with gold (Au) or with a nickel and gold (Au) composite to enable soldering. The plating material may be electrolytically plated on the metal patterns 120, 130, 140 as described further below.

An optoelectronic device such as an optical transmitter (e.g., a laser driver, a laser diode, or an isolator) or an optical receiver (a trans-impedance amplifier or a pin diode) may be built on the second and third metal patterns 130, 140.

The circuit package 100 may further include a heat sink component 200 to provide greater thermal conductivity to the circuit package 100. The heat sink 200 may be, but is not limited to, a copper tungsten (CuW) heat sink 200. The heat sink 200 may be configured as a pedestal block having an upper body portion 210 having a perimeter edge and a top surface 215. The heat sink 200 may further include a lower body portion 220 also having a perimeter edge and a bottom surface 225. Use of terminology such as "upper," "lower," "top" and "bottom" is merely for the sake of describing the figures and is not intended to necessarily be descriptive of the orientation of the circuit package 100 or its components to any particular orientation and should not be construed as a limitation on the scope of the claims. The top surface 215 of the upper body portion 210 may have a smaller surface area than the bottom surface 225 of the lower body portion 220, such that the lower body portion 220 may act as a flange extending outwardly from the upper body portion 210.

The opening 165 may engage the upper body portion 210 of the heat sink 200. The perimeter edge and thickness of the opening 165 and the perimeter edge and thickness of the upper body portion 210 may be substantially the same such that when the opening 165 engages the heat sink 200, the resulting structure is monolithic. The size of the upper body portion 210 may be slightly smaller than the opening 165 to accommodate a bonding agent to securely bond the heat sink 200 to the substrate 110. Though the upper body 210 and the opening 165 are shown to be generally cuboid in shape, the shapes and sizes are not limited thereto and any shape or size may be used such that the heat sink 200 may be accommodated within the opening 165 of the substrate 110. The size of the heat sink 200, including the surface area of the top surface 215 may be sufficient to effectively dissipate heat generated by an optoelectronic device built on the substrate 10 without the aid of additional heat sinks or other means of thermal dissipation such as thermal vias built within the substrate 110. Likewise, the surface area of the bottom surface 225 may be sufficient to effectively transfer the dissipated heat away from the optoelectronic device.

The lower body portion or flange 220 may engage the bottom surface 160 of the substrate 110 to prevent the heat sink 200 from sliding out of the opening 165. The bottom surface 160 may include a depression to accommodate the flange 220 such that the bottom surface 225 of the heat sink 200 is flush with the bottom surface 160 of the substrate, and the top surface 215 of the heat sink 200 is flush with the top surface 150 of the substrate 110. The top surface 215 of the heat sink 200 may thereby remain exposed on the top surface 150 of the substrate 110, and the bottom surface 225 of the heat sink 200 may remain exposed on the bottom surface 160 of the substrate 110. The shape and size of the opening 125 of the first metal pattern 120 may also cause the surface area of the bottom surface 225 of the heat sink 200 to remain exposed through the first metal pattern 120. Likewise, the shape and size of the opening 145 of the third metal pattern 140 may cause the surface area of the top surface 215 to remain exposed through the third metal pattern 140. An optoelectronic device may thereby be formed directly on the top surface 215 of the heat sink 200.

Figure 2:
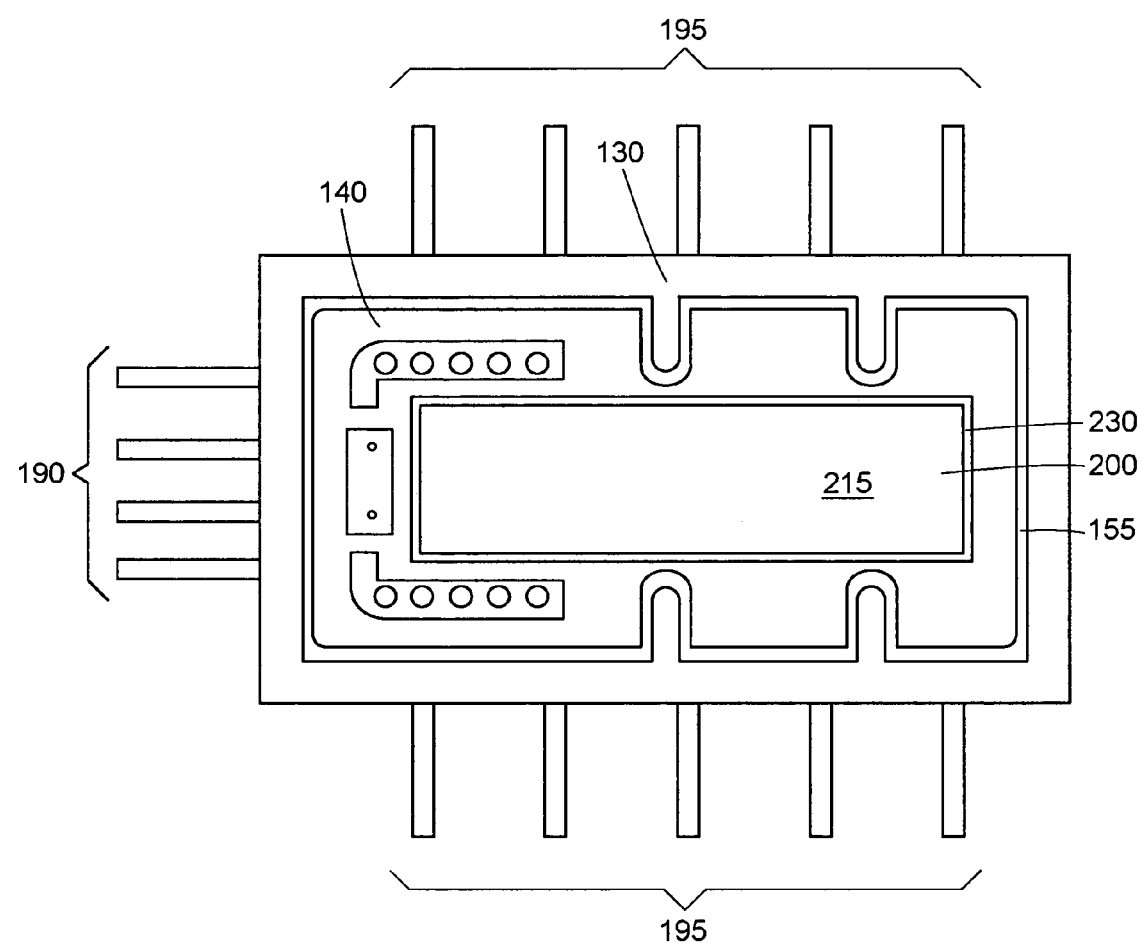
FIG. 2 is a top view representation of a circuit package.

The heat sink 200 may be mounted in the opening 165 of the substrate 110 by brazing an alloy such as, but not limited to, a copper silver (CuAg) braze alloy. Because of the melting temperature of copper silver, the heat sink 200 may be brazed to the substrate 110 to form a single, monolithic component as shown in FIGS. 2 and 3. The brazing alloy 230 may be disposed between the sidewalls of the opening 165 and the sidewalls of the upper body portion 210 of the heat sink to provide a hermetic seal between the opening 165 and the heat sink 200.

Accordingly, optoelectronic devices may be soldered because persons of ordinary skill in the art will readily appreciate that brazing occurs at a higher temperature than soldering so that the heat sink 200 may remain intact to the substrate 110. Because of its properties, the heat sink 200 may provide thermal conductivity to dissipate heat generated by an optoelectronic device built on the circuit package 100. For example, a laser driver may be built on the heat sink 200. With the heat sink 200, the circuit package 100 may provide improved thermal dissipation. The substrate 110 may maintain RF integrity of an optoelectronic device built on the circuit package (e.g., preventing electrical shorts) and the brazing may hermetically seal the circuit package.

Figure 4:
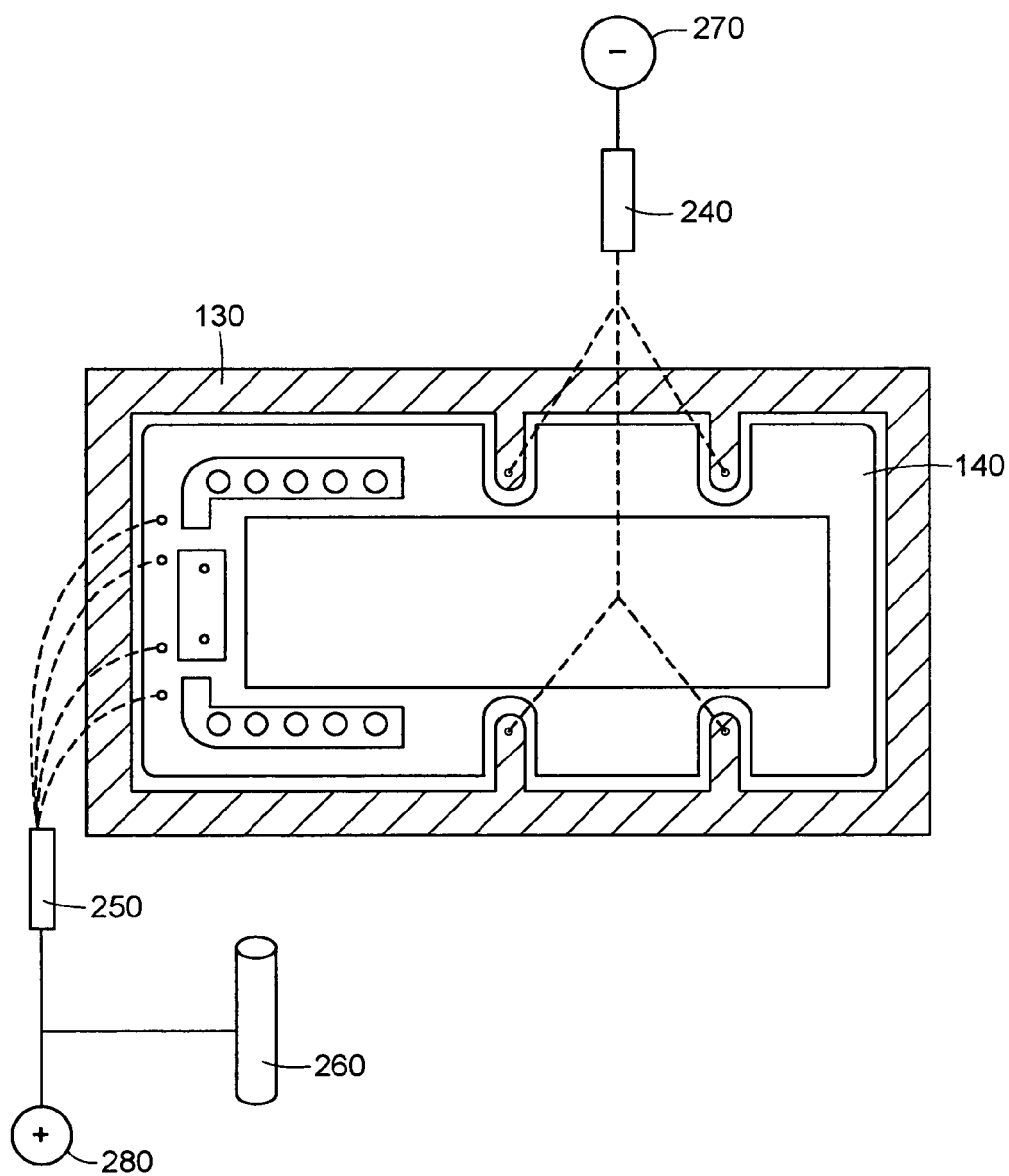
FIG. 4 is a representation of a selective plating process.

As mentioned above, the first metal pattern 120 and third metal pattern 140 may be plated differently than the second metal pattern 130. In order to plate the patterns with different metals, a selective plating process that does not introduce impurities in each plated pattern (e.g., gold impurities are not introduced to a nickel-plated pattern) may be used. While FIG. 4 may indicate the vias 170, 180 are exposed through the second metal pattern 130 and the third metal pattern 140, the vias 170, 180 are merely shown in this drawing for demonstrative purposes and are generally not exposed through their respective metal patterns. Referring to FIG. 4 a selective plating process is demonstrated. The selective plating process utilizes electrolytic plating to plate a particular pattern with a particular metal. Electrolytic plating may be used over electroless plating because electroless plating may introduce contaminants into the plating material. Subsequently, if a laser welding process is used (e.g., for hermetic sealing), the laser welding may cause cracks in the plating due to the contaminants. This may result in a non-hermetic sealing of the device.

The substrate 110 may initially include the vias 170, 180, the first metal pattern 120, the second metal pattern 130 and the third metal pattern 140, each of which may be applied using mask and sputtering techniques or photoresistance techniques, as known to those of ordinary skill in the art. The pins 195, 197, and heat sink 200 may be applied in separate processes before or after the plating process. As seen in FIG. 4, a cathode 240 may be electrically coupled to the metal pattern being plated, as designated by the dotted lines. The vias 170, 180 may be used to electrically couple the first, second and third metal patterns 120, 130, 140 to various voltage source to create a potential voltage difference between the various metal patterns. For example, if the second metal pattern 130 is being plated with nickel, the second metal pattern may be electrically coupled to a cathode 240 by electrically coupling one or more of the second plurality of vias 180 to the cathode 240. Likewise, if the third metal pattern 140 is being plated with gold, the third metal pattern 140 may be electrically coupled to the cathode 240 by electrically coupling one or more of the first plurality of vias 170 to the cathode. Conversely, the metal pattern not being plated may be electrically coupled to an anode 250 using the appropriate vias 170, 180. A plating metal source 260 may also be electrically coupled to the anode 250. For example, if the second metal pattern 130 is being plated with nickel, the metal source 260 may be a nickel bar or other nickel source; and if the third metal pattern 140 is being plated with gold, the source metal 260 may be a gold bar or other gold source.

Though the following will describe a nickel-plating process applied to the second metal pattern 130, those of ordinary skill in the art will readily recognize how the following process may be applied to other metal patterns for plating different types of metals. The substrate 110 with the metal patterns 120, 130, 140 and a nickel metal source 240 may be submersed in a solution or acid bath containing a salt or other dissolvable source of nickel such as, but not limited to, nickel chloride ($NiCl_2$). The nickel salt may ionize in water or acid bath into positively charged nickel ($Ni^{++}$) ions.

A potential voltage difference may be created between the second metal pattern 130 and the metal source 260, such that the voltage potential of the first metal pattern is less than the voltage potential of the metal source. For example, the cathode 240 may be electrically coupled to a negative electrical source 270 to provide a negative charge to the second metal pattern 130, and an anode 250 may be electrically coupled to a positive electrical source 280 to provide a positive charge to the nickel metal source 260. The negative charge may be applied through the vias 180. A potential voltage difference may also be created by electrically coupling the second metal pattern 130 to ground, whereas a positive charge may be applied to the metal source 260. A potential voltage difference may also be created between the second metal pattern 130 and the remaining metal pattern(s) 120, 140. The first metal pattern 120, the third metal pattern 140 and the nickel metal source 260 may all be electrically coupled to the same positive electrical source 280 to avoid a potential voltage difference between the two.

When a potential voltage difference is created between the second metal pattern 130 and the metal source 260 where the potential voltage of the second metal pattern 130 is less than the potential voltage of the metal source 260, positively charged nickel ($Ni^{++}$) ions are attracted to the potential voltage of the second metal pattern 130 thereby electrolytically plating the second metal pattern 130 with nickel. A positively charged nickel source 260 may replenish the positively charged nickel ($Ni^{++}$) ions in the solution to continue the plating process by oxidizing the nickel source 260 and dissolving the nickel source 260 into positively charged nickel ($Ni^{++}$) ions. Because the first metal pattern 120 and the third metal pattern 140 may also have a potential voltage the same as the potential voltage of the metal source 260 and greater than the potential voltage of the second metal pattern 130, the positively charged nickel ($Ni^{++}$) ions will not be attracted to, and therefore not plated on, the first metal pattern 120 or the third metal pattern 140.

Once the desired amount of nickel has been disposed on the second metal pattern 130, the substrate 110 may be removed from the solution or acid bath and cleaned. The substrate 110 may then be submersed in another solution or acid bath containing metal ions of a different metal to be plated on a remaining metal pattern. For example, the first and third metal patterns 120, 140 may be plated with gold (Au), and the substrate 110 with the metal patterns may be submersed in a solution or acid bath having dissolved, positively charged gold ions. The cathode 240 may be electrically coupled to the first and third metal patterns 120, 140 to provide a negative charge from the negative electrical source 270, and the anode 250 may be electrically coupled to the gold source and the second metal pattern 120 and a positive charge may be applied from the positive electrical source 280. The negatively charged first and third metal patterns 120, 140 may attract the gold ions to electrolytically plate the first and third metal patterns 120, 140 with gold, and because the second metal pattern 130 is positively charged, the second metal pattern 130 will not attract or be plated with gold.

Although the circuit packages disclosed herein are particularly well suited for optoelectronic devices such as optical transmitting units and optical receiving units, persons of ordinary skill in the art will readily appreciate that the teachings herein are in no way limited to such units. Persons of ordinary skill in the art will readily appreciate that the teachings of this disclosure can be employed with other devices that require hermetical sealing or selective plating. Likewise, persons of ordinary skill in the art will readily appreciate that other methods of electrolytic plating may also be utilized and the process described herein is not limited to any one particular electrolytic plating process or to any particular metal plating.

Many changes and modifications to the embodiments described herein could be made. The scope of some changes is discussed above. The scope of others will become apparent from the appended claims.

What is claimed is:

1. A circuit package comprising:
   a base portion having a first surface, a second surface, a first via, a second via, and a plurality of pins;
   a first metal pattern disposed on the first surface;
   a second metal pattern electrolytically and selectively plated with a metal of a first type disposed on the second surface, the second metal pattern being electrically coupled to the first via; and
   a third metal pattern electrolytically and selectively plated with a metal of a second type different from the first type disposed on the second surface and arranged to form a gap to electrically isolate the second metal pattern from the third metal pattern, the third metal pattern being electrically coupled to the first metal pattern through the second via.

2. The circuit package of claim 1, wherein the base portion comprises a substrate.

3. The circuit package of claim 2
   wherein the substrate comprises an opening, wherein the first surface comprises a top surface and wherein the second surface comprises a bottom surface; the circuit package further comprising a single unitary heat sink having a top surface and a bottom surface, the heat sink positioned within the opening such that the top surface is exposed through the top surface of the substrate and the bottom surface is exposed through the bottom surface of the substrate.

4. The circuit package of claim 3
wherein the opening comprises a first perimeter edge; and
wherein the single unitary heat sink comprises a body having the same size and same shape as the opening, and a flange extending outwardly from the body having a second perimeter edge larger than the first perimeter edge.

5. The circuit package of claim 3 wherein the heat sink is engaged with the substrate via a braze alloy, the braze alloy providing a hermetic seal between the opening and the heat sink.

6. The circuit package of claim 5, wherein the braze alloy comprises a copper silver braze alloy.

7. The circuit package of claim 3, wherein the heat sink comprises a copper tungsten alloy heat sink.

8. The circuit package of claim 3, wherein the single unitary heat sink comprises an upper body portion engaging the opening of the substrate and a lower body portion opposite the upper body portion.

9. The circuit package of claim 3, wherein the top surface of the single heat sink comprises a surface area sufficient to effectively dissipate heat.

10. The circuit package of claim 3, wherein the bottom surface of the single heat sink comprises a surface area sufficient to effectively dissipate heat through the heat sink.

11. The circuit package of claim 3, wherein the bottom surface of the single heat sink comprises a surface area larger than the opening and wherein the single heat sink comprises a lower body portion forming a flange for engaging the heat sink in the opening.

12. The circuit package of claim 3, wherein the bottom surface of the single heat sink is coplanar with the bottom surface of the substrate.

13. The circuit package of claim 3, wherein the top surface of the single heat sink is coplanar with the top surface of the substrate.

14. The circuit package of claim 1, wherein the base portion comprises a ceramic substrate.

15. The circuit package of claim 1, wherein the base portion comprises one of an alumina substrate and an aluminum nitride (AlN) substrate.

16. The circuit package of claim 1 further comprising:
a plated pattern comprising the metal of the second type electrolytically and selectively disposed on the first metal pattern.

17. The circuit package of claim 16, wherein the plated pattern comprises a gold plated pattern.

18. The circuit package of claim 16, wherein the plated pattern comprises a nickel plated pattern.

19. The circuit package of claim 1, wherein the first metal type comprises nickel.

20. The circuit package of claim 1, wherein the second metal type comprises gold.

21. The circuit package of claim 1, wherein at least one of the metal of the first type and the metal of the second type comprises a composite.

22. A circuit package comprising:
a base portion having a first surface, a second surface, a first via, a second via, and a plurality of pins;
a first metal pattern disposed on the first surface;

a second metal pattern disposed on the second surface, the second metal pattern being electrically coupled to the first via;
a nickel-plated pattern electrolytically and selectively disposed on the second metal pattern;
a third metal pattern disposed on the second surface and arranged to form a gap to electrically isolate the second metal pattern from the third metal pattern, the third metal pattern being electrically coupled to the first metal pattern through the second via; and
a plated pattern having a metal different from the nickel-plated pattern electrolytically and selectively disposed on the third metal pattern.

23. A circuit package comprising:
a base portion having a first surface, a second surface, a first via, a second via, and a plurality of pins;
a first metal pattern disposed on the first surface;
a second metal pattern disposed on the second surface, the second metal pattern being electrically coupled to the first via;
a third metal pattern disposed on the second surface and arranged to form a gap to electrically isolate the second metal pattern from the third metal pattern, the third metal pattern being electrically coupled to the first metal pattern through the second via;
a gold-plated pattern electrolytically and selectively disposed on the third metal pattern; and
a plated pattern having a metal different from the gold-plated pattern electrolytically and selectively disposed on the second metal pattern.

24. A circuit package comprising:
a base portion having a first surface, a second surface, a first via, a second via, and a plurality of pins;
a first metal pattern disposed on the first surface;
a second metal pattern electrolytically and selectively plated with a first metal, the second metal pattern disposed on the second surface, the second metal pattern being electrically coupled to the first via;
a third metal pattern electrolytically and selectively plated with a second metal different from the first metal, the third metal pattern disposed on the second surface and arranged to form a gap to electrically isolate the second metal pattern from the third metal pattern, the third metal pattern being electrically coupled to the first metal pattern through the second via; and
a single unitary heat sink arranged to dissipate heat from a device built on the circuit package,
wherein the base portion comprises an opening arranged to engage the heat sink, and
wherein the third metal pattern comprises an opening arranged to expose the device to the heat sink.

25. The circuit package of claim 24,
wherein the base portion opening comprises a first perimeter edge, and
wherein the heat sink comprises:
a body having the same size and same shape as the base portion opening, and
a flange extending outwardly from the body having a second perimeter edge larger than the first perimeter edge.

26. The circuit package of claim 24, wherein the heat sink is engaged with the base portion via a braze alloy, the braze alloy providing a hermetic seal between the opening and the heat sink.

27. The circuit package of claim 26, wherein the braze alloy comprises a copper silver braze alloy.

28. The circuit package of claim 24, wherein the heat sink comprises a copper tungsten alloy heat sink.

29. The circuit package of claim 24,
wherein the heat sink comprises an upper surface and a lower surface having more surface area than the upper surface, and
wherein the upper surface is exposed on the second base portion surface and the lower surface is exposed on the first base portion surface when the heat sink is engaged with the base portion.

* * * * *